United States Patent
St. Germain

(10) Patent No.: US 9,929,979 B2
(45) Date of Patent: Mar. 27, 2018

(54) SCALABLE CROSSPOINT SWITCH

(71) Applicant: Analog Devices, Inc., Norwood, MA (US)

(72) Inventor: Michael C. St. Germain, Somerville, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 51 days.

(21) Appl. No.: 14/990,620

(22) Filed: Jan. 7, 2016

(65) Prior Publication Data

US 2017/0201467 A1    Jul. 13, 2017

(51) Int. Cl.
*H04L 12/931*    (2013.01)
*H04L 12/863*    (2013.01)

(52) U.S. Cl.
CPC ............. *H04L 49/40* (2013.01); *H04L 47/62* (2013.01)

(58) Field of Classification Search
CPC . H04L 49/101; H04L 49/1515; H04L 12/863; H04L 12/931; G02B 2006/12145; G02B 6/3546; H04Q 11/0005
See application file for complete search history.

(56) References Cited

U.S. PATENT DOCUMENTS

| | | |
|---|---|---|
| 5,777,505 A | 7/1998 | LaRue |
| 5,796,268 A * | 8/1998 | Kaplinsky ........ H03K 19/17736 326/39 |
| 5,910,780 A | 6/1999 | Tam |
| 6,081,473 A * | 6/2000 | Agrawal ............ H03K 19/1776 326/38 |
| 6,529,518 B1 * | 3/2003 | Webber ................. H04L 12/433 370/258 |
| 6,557,070 B1 | 4/2003 | Noel, Jr. |
| 6,580,359 B1 | 6/2003 | Tam |
| 6,738,858 B1 | 5/2004 | Fernald et al. |
| 6,795,393 B1 * | 9/2004 | Mazzurco ................. H04J 3/14 370/217 |

(Continued)

FOREIGN PATENT DOCUMENTS

EP    0283296    5/1990

OTHER PUBLICATIONS

Analog Devices, Inc., "200 MHz, 16×16 Buffered Video Crosspoint Switch", AD8116 Datasheet, Rev. B, 2001, 28 pages.

(Continued)

*Primary Examiner* — Mohamed Kamara
(74) *Attorney, Agent, or Firm* — Patent Capital Group

(57) ABSTRACT

A crosspoint switch matrix may include a plurality of point cells provided at intersections between a plurality of input pathways and a plurality of output pathways. The input pathways may be partitioned into groups, each group defined by a demultiplexer that forwards an input signal to the point cells within the group and/or to a demultiplexer of a succeeding group. The output pathways may be partitioned into groups, each group defined by a multiplexer that forwards a signal from an active point cell to an output of the matrix. Multiplexers of groups in intermediate positions between the point cell and the matrix output may relay the output signal between the multiplexers along a bypass pass. When both the input pathways and output pathways are so partitioned, each point cell may be a member of one input pathway group and one output pathway group.

16 Claims, 13 Drawing Sheets

(56) References Cited

U.S. PATENT DOCUMENTS

| | | | |
|---|---|---|---|
| 6,836,353 B1* | 12/2004 | Ramadas | H04J 14/0241 359/281 |
| 6,965,299 B1 | 11/2005 | Daily et al. | |
| 7,139,292 B1 | 11/2006 | Evans et al. | |
| 7,492,782 B2 | 2/2009 | Jun et al. | |
| 7,710,153 B1 | 5/2010 | Masleid et al. | |
| 8,289,127 B2 | 10/2012 | Bankman et al. | |
| 8,705,546 B2 | 4/2014 | Bankman et al. | |
| 9,077,338 B1 | 7/2015 | Schulz et al. | |
| 9,157,952 B2 | 10/2015 | Becker et al. | |
| 9,178,505 B2 | 11/2015 | Masleid et al. | |
| 2005/0270137 A1* | 12/2005 | Yarbrough, III | H01P 1/127 340/2.28 |
| 2015/0318889 A1* | 11/2015 | Lee | H04B 1/44 455/78 |

OTHER PUBLICATIONS

Analog Devices, Inc., "600 MHz, 32×32 Buffered Analog Crosspoint Switch", AD8117/AD8118 Datasheet, Rev. A, May 2007, 36 pages.

Analog Devices, Inc., "Xstream 33×17, 1.5 Gbps Digital Crosspoint Switch", AD8150 Datasheet, Rev. A, Sep. 2005, 44 pages.

Analog Devices, Inc., "Xstream 34×34, 3.2 Gbps Asynchronous Digital Crosspoint Switch", AD8152 Datasheet, Rev. A, Jan. 2003, 32 pages.

Analog Devices, Inc., "Xstream 4.25 Gbps, 16×16, Digital Crosspoint Switch", ADN4604 Datasheet, Rev. A, Mar. 2013, 40 pages.

Analog Devices, Inc., "Xstream 4.25 Gbps 40×40 Digital Crosspoint Switch", ADN4605 Datasheet, Rev. A, Nov. 2011, 56 pages.

Analog Devices, Inc., "Xstream 11.3 Gbps, 12×12 Digital Crosspoint", ADN4612 Datasheet, Rev. A, Oct. 2013, 76 pages.

St. Germain, Tree Structure Diagram of Input/Output Pathway of a Crosspoint Switch, Feb. 2014 (unpublished).

Office Action issued in DE Patent Application Serial No. 10-2016-125-719.2 dated Dec. 1, 2017, 12 pages (including EN Summary).

\* cited by examiner

100

800

900

900

900

1300

SCALABLE CROSSPOINT SWITCH

BACKGROUND

The present invention generally relates to a crosspoint switch.

A crosspoint switch is an electronic system that includes a collection of switches arranged in a matrix configuration. A crosspoint switch has multiple input and output signal paths that cross the matrix. A switch (called a "point cell" herein) is provided at intersections between the input and output pathways. When a point cell is activated, the point cell outputs a signal that is present on its input to its output. Thus, the crosspoint switch may communicate signals from its inputs to its outputs. Crosspoint switches find application in computer networks, communications and telephony networks, and other data routing applications.

The matrix may be controlled to propagate signals in a variety of ways. In one configuration, each input signal may be output to a single output. Thus, a single point cell on each input pathway may be activated, which causes its respective input signal to be output to a respective output pathway. In another configuration, a single input signal may propagate to all outputs of the crosspoint switch. In this configuration, all point cells on an input pathway may be activated, which causes the signal on the input pathway to be output to all output pathways. And, of course, the matrix may be controlled that a single input may be output to a subset of output pathways and other inputs may be output to other outputs that are not members of the subset being used by the first input pathway. Thus, crosspoint switches must be able to accommodate a variety of switching configurations on a dynamic basis.

In order for a crosspoint switch to reliably communicate signals from its inputs to its outputs, sufficient bandwidth must be maintained on the input and output pathways. If the bandwidth on the pathways is too low relative to the data rate, then intersymbol interference (ISI) will corrupt the signals. As the number of inputs and/or outputs of a crosspoint switch increases, the capacitance on the pathways and the power required by the buffers driving the pathways tend to increase linearly for a given bandwidth. Additionally, for a given data rate and power, the number of crosspoint connections is limited by the bandwidth on the pathways. Manufacturing buffers capable of driving the pathways with sufficient bandwidth is generally limited by the capability of the solid-state technology manufacturing process and maximum allowable power consumption.

Therefore, the inventor recognized a need in the art for a scalable crosspoint switch having reduced power consumption.

DETAILED DESCRIPTION

Embodiments of the present disclosure may provide a crosspoint switch matrix that includes a plurality of point cells provided at intersections between a plurality of input pathways and a plurality of output pathways. The input pathways and/or output pathways may be partitioned into groups having a pair of communication paths. A first communication path may be coupled to the point cells in a respective group. A second communication path may be a path that connects to an adjacent group. When input pathways are partitioned in this manner, each group may be defined by a demultiplexer that forwards an input signal to the point cells within the group and/or to a demultiplexer of a succeeding group, depending on the way in which the crosspoint switch matrix is to be used. When output pathways are partitioned in this manner, each group may be defined by a multiplexer that forwards a signal from an active point cell to an output of the matrix. Multiplexers of groups in intermediate positions between the point cell and the matrix output may relay the output signal between the multiplexers along a bypass pass. When both the input pathways and output pathways are so partitioned, each point cell may be a member of one input pathway group and one output pathway group.

Figure 1:
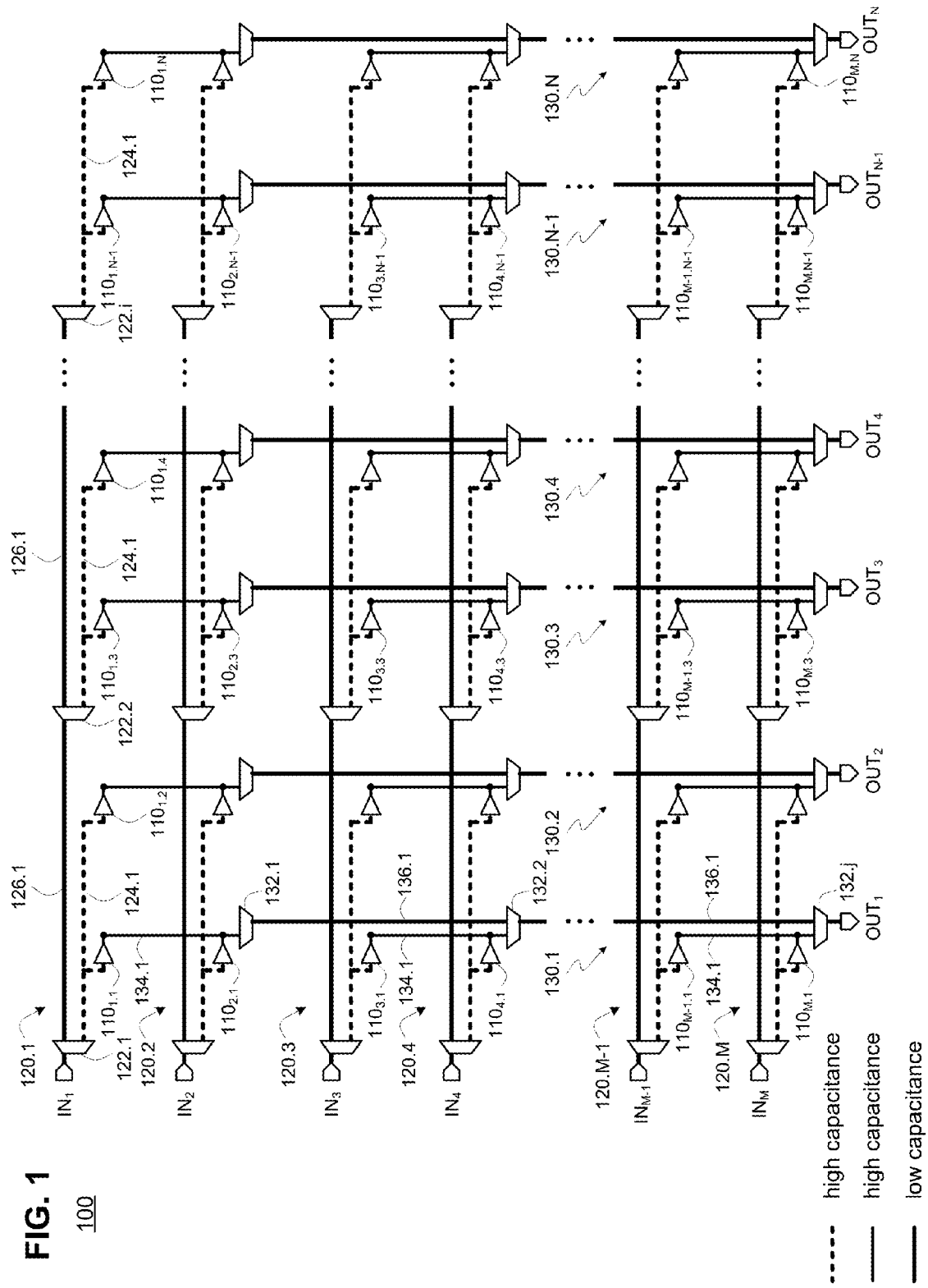
FIG. 1 illustrates a crosspoint switch according to an embodiment of the present disclosure.

FIG. 1 illustrates a crosspoint switch matrix 100 according to an embodiment of the present disclosure. The switch 100 is illustrated as an M×N matrix that includes a plurality of point cells $110_{1.1}$-$110_{M,N}$, M input pathways 120.1-120.M and N output pathways 130.1-130.N. One point cell $110_{1.1}$, . . . , $110_{M,N}$ may be provided at each intersection between the M input pathways 120.1-120.M and the N output pathways 130.1-130.N. The input pathways 120.1-120.M may be segmented into a plurality of groups. Within the input pathway groups, the input pathways 120.1-120.M may include a first transmission line that carries signals to point cells within the group and a second transmission line that carries signals between groups of the respective input pathways. The output pathways 130.1-130.N also may be segmented into a plurality of groups. Within the output pathway groups, the output pathways 130.1-130.N may include a first transmission line that accepts outputs from the point cells within the group and a second transmission line that carries signals between groups of the respective output pathways. Thus, each point cell $110_{1.1}$-$110_{M,N}$ within the crosspoint matrix may receive an input signal from its associated demultiplexer on an input pathway and may output a signal to its associated multiplexer on an associated output pathway. Communication between groups along the input and output pathways may occur via the second transmission lines.

Each input pathway (say, pathway 120.1) may be segmented into a plurality of groups by a plurality of demultiplexers 122.1-122.i. The number of groups and the number of point cells per group may be tailored to suit individual application needs. Within each group, the input pathway 120.1 may be represented by a pair of transmission lines 124.1, 126.1. A first transmission line 124.1 (called an "input main path" herein for convenience) may carry an input signal from its demultiplexer 122.1 to the point cells $110_{1.1}$, $110_{1.2}$ in the demultiplexer's 122.1 respective group. The second transmission line 126.1 (called an "input bypass path" herein for convenience) may carry the input signal from its demultiplexer (e.g., 122.1) to a demultiplexer (e.g., 122.2) of a next group, if any. Of course, an input bypass path is not required in a final group of the input pathway, following the final demultiplexer 122.i. The first demultiplexer 122.1 may have an input $IN_1$ that receives an input signal for the input pathway 120.1; typically the input signal may be provided by an input channel buffer (not shown) or other crosspoint control apparatus.

Similarly, the output pathways (say, pathway 130.1) also may be segmented into a plurality of groups by respective multiplexers 132.1-132.j. Here, again, the number of groups and the number of point cells per group may be tailored to suit individual application needs. Within each group, the output pathway 130.1 may be represented by a pair of transmission lines 134.1, 136.1. A first transmission line 134.1 (called an "output main path" herein for convenience) may carry an output signal from one of the point cells $110_{1.1}$, $110_{2.1}$ within the multiplexer's 132.1 respective group. The second transmission line 136.1 (called an "output bypass path" herein for convenience) may carry an output signal from a multiplexer (e.g., 132.1) of a prior group (if any) to the multiplexer (e.g., 132.2) of the present group. Of course, an output bypass path is not required in a first group of the output pathway 130.1, preceding the first multiplexer 132.1. A final multiplexer 132.j may have an output $OUT_1$ that outputs the output signal from the output pathway 130.1; typically the output signal is provided to an output channel buffer (not shown) or other crosspoint control apparatus.

The architecture of the crosspoint switch matrix 100 is expected to conserve power during operation. Conventional crosspoint switch matrices often include input and output signal pathways that cross the entire switch matrix and have high capacitances due to loading of the point cells across the switch matrix. Accordingly, such crosspoint switches include signal drivers/buffers that must be robust enough to drive signals the entire length of the system's transmission lines. The architecture illustrated in FIG. 1, however, partitions signal pathways 120.1-120.M and 130.1-130.N into segments that are smaller than the entirety of the crosspoint switch matrix 100; each segment includes a main path coupled to a small group of point cells and a bypass path bypassing the point cells. Although the main paths have higher capacitances than the bypass paths due to loading of the point cells, the capacitances of the main paths and the bypass paths are expected to be lower than the capacitances of pathways in a conventional crosspoint switch matrix of similar size.

Figure 2:
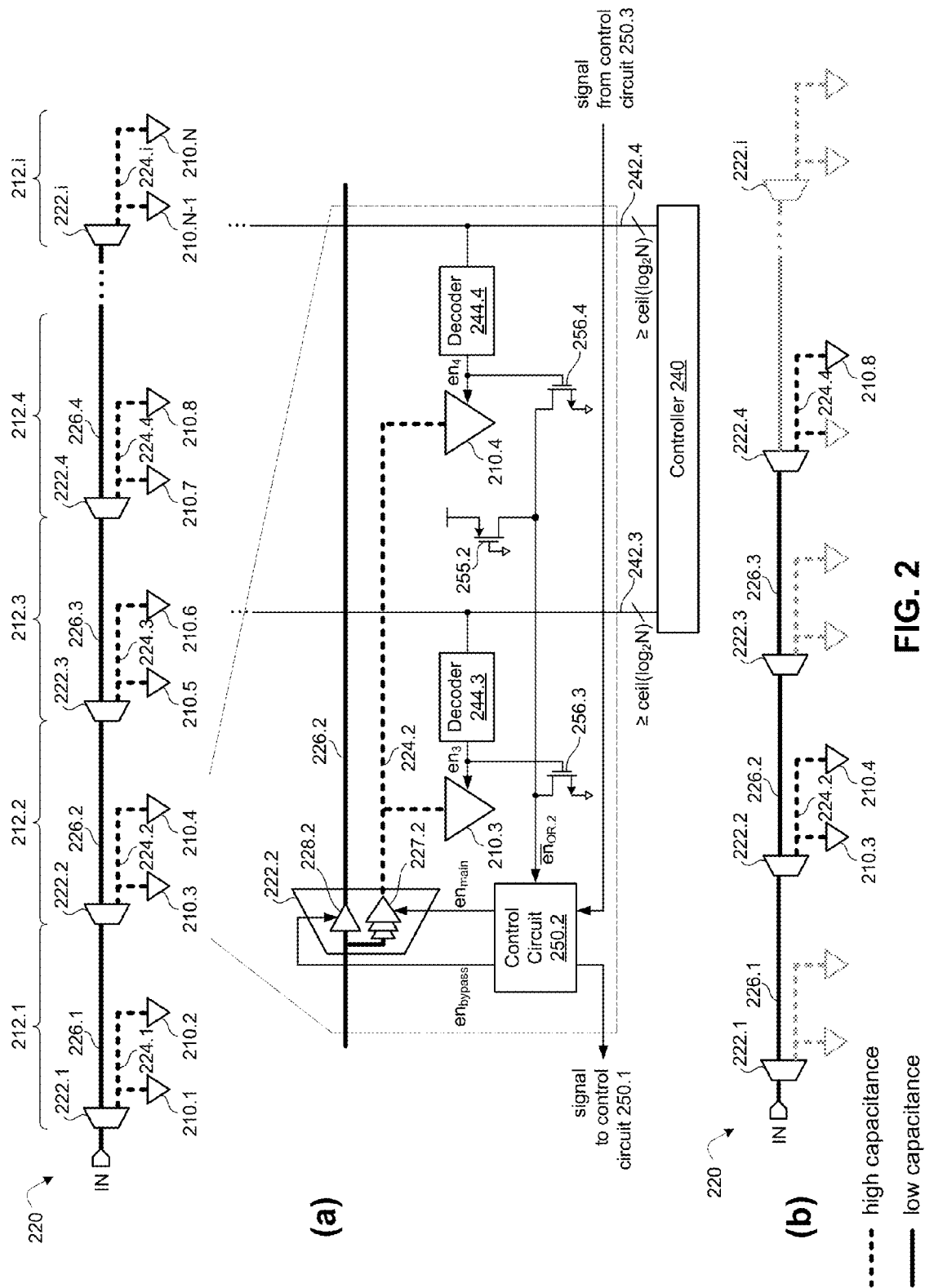
FIG. 2 illustrates an input pathway according to an embodiment of the present disclosure.

FIG. 2 illustrates an input pathway 220 according to an embodiment of the present disclosure. The input pathway 220 may correspond to one of the input pathways 120.1-120.M of FIG. 1. As shown in FIG. 2(a), the input pathway 220 may include a plurality of point cells 210.1-210.N arranged into a plurality of groups 212.1-212.i and a plurality of demultiplexers 222.1-222.i, one for each group 212.1, . . . , 212.i. Within each group 212.1, . . . , 212.i, the corresponding demultiplexer 222.1, . . . , 222.i may drive a signal to point cells within the group and/or to a subsequent downstream demultiplexer.

The input pathway 220 may be segmented into a plurality of groups 212.1-212.i by a plurality of demultiplexers 222.1-222.i. The number of groups and the number of point cells per group may be tailored to suit individual application needs. Within each group (say, group 212.1), the input pathway 220 may include an input main path 224.1 and an input bypass path 226.1. The input main path 224.1 may be a transmission line that carries an input signal from its demultiplexer 222.1 to the point cells 210.1, 210.2. The input bypass path 226.1 may be a transmission line that carries the input signal from its demultiplexer 222.1 to a demultiplexer 222.2 of a next downstream group (if any). Of course, an input bypass path is not required in a final group 212.i of the input pathway 220, following the final demultiplexer 222.i. The first demultiplexer 222.1 may have an input IN that receives an input signal for the input pathway 220; typically the input signal may be provided by an input channel buffer (not shown) or other control apparatus.

Each demultiplexer (say, demultiplexer 222.2) may include a main buffer 227.2 and a bypass buffer 228.2. When enabled, the main buffer 227.2 may drive a signal at an input of its demultiplexer 222.2 via an input main path 224.2 to the corresponding point cells 210.3, 210.4. When enabled, the bypass buffer 228.2 may drive a signal at the input of its demultiplexer 222.2 via an input bypass path 226.2 to a next downstream demultiplexer 222.3. Each group (say, group 212.2) may include a control circuit 250.2 to enable the main buffer 227.2 with a control signal $en_{main}$ and the bypass buffer 228.2 with a control signal $en_{bypass}$. The control circuit 250.2 may enable the main buffer 227.2 based on when a signal $\overline{en}_{OR.2}$ is low, which is indicative of when a controller 240 enables one or more point cells in its associated group. The control circuit 250.2 may enable the bypass buffer 228.2 when it receives a signal from a downstream control circuit 250.3 indicating that one or more point cells in the downstream groups (i.e., groups 212.3-212.i) are activated. Similarly, the control circuit 250.2 may provide a signal to an adjacent upstream control circuit 250.1 to indicate that one or more point cells in its group and/or the downstream groups are activated.

A point cell 210.1, . . . , 210.N may be enabled when addressed by a multibit word that may be transmitted by the controller 240 over an address line 242.1, . . . , 242.N and that may be decoded as an enable signal $en_1$, . . . , $en_N$ by a decoder 244.1, . . . , 244.N. Each address line 242.1, . . . , 242.N may include S address lines, where S≥ceil($\log_2$ N) (e.g., $\log_2$ N, rounded up to the next integer). Decoders 244.1-244.N may be part of a distributed decoder and may be incorporated in the point cells 210.1-210.N, respectively. The controller 240 may enable one or more of the point cells 210.1-210.N at a time. For clarity, only address lines 242.3-242.4 and decoders 244.3-244.4 are shown in FIG. 2(a).

Each group (say group 212.2) may include a p-type transistor 255.2 having its drain coupled to the control circuit 250.2 and drains of a plurality of n-type transistors 256.3, 256.4. The group 212.2 is shown with two n-type transistors 256.3, 256.4, but may be tailored to have as many such transistors as the number of point cells in a group of an input path (e.g., group 212.1, . . . , 212.i). The transistor 255.2 may have its source pulled up to a high voltage supply and its gate grounded. The transistors 256.3, 256.4 may have their sources grounded or pulled down to a low voltage supply, and may receive the enable signals $en_3$, $en_4$ respectively at their gates. When the point cells 210.3, 210.4 are inactive (e.g., the enable signals $en_3$, $en_4$ are low), the transistor 255.2 may pull the signal $\overline{en}_{OR.2}$ high. However, when one or both of the point cells 210.3, 210.4 get enabled (e.g., one or both of the enable signals $en_3$, $en_4$ are high), the corresponding transistors 256.3, 256.4 may pull the signal $\overline{en}_{OR.2}$ low. The control circuit 250.2 may enable the main buffer 227.2 when the signal $\overline{en}_{OR.2}$ is low, as will be described below in FIGS. 4 and 5.

A configuration of the input pathway 220 is shown in FIG. 2(b), where point cells 210.3, 210.4, 210.8 may be enabled by the controller 240. In this scenario, a control circuit 250.2 associated with the enabled point cells 210.3, 210.4 may enable a main buffer 227.2 of a demultiplexer 222.2 and send a signal to control circuit 250.1 to enable bypass buffer 228.1 of demultiplexers 222.1. The enabled bypass buffer 228.1 thus may drive a signal received at the input IN through input bypass path 226.1 to the demultiplexer 222.2. Thereafter, the enabled main buffer 227.2 may drive the received signal through an input main path 224.2 to the point cells 210.3, 210.4. Similarly, a control circuit 250.4 associated with the enabled point cell 210.8 may enable a main buffer 227.4 of a demultiplexer 222.4 and serially send a signal to control circuits 250.1-250.3 to enable bypass buffers 228.1-228.3 of demultiplexers 222.1-222.3, respectively (although bypass buffer 228.1 was already enabled). The enabled bypass buffers 228.1-228.3 then may drive the signal received at the input IN through the input bypass paths 226.1-226.3 to the demultiplexer 222.4. Thereafter, the enabled main buffer 227.4 may drive the received signal through an input main path 224.4 to the point cell 210.8.

As can be seen from this example, a main buffer 227.2 of a demultiplexer 222.2 may be enabled when one or more point cells 210.3, 210.4 corresponding to the demultiplexer 222.2 are enabled. A main buffer 227.3 of a demultiplexer 222.3 may be disabled when none of its point cells 210.5, 210.6 is enabled. Moreover, a bypass buffer 228.2 of the demultiplexer 222.2 may be enabled when one or more point cells connected to a downstream demultiplexer are enabled (e.g., point cell 210.8). A bypass buffer 228.4 of a demultiplexer 222.4 may be disabled if no downstream point cell is enabled.

Figure 3:
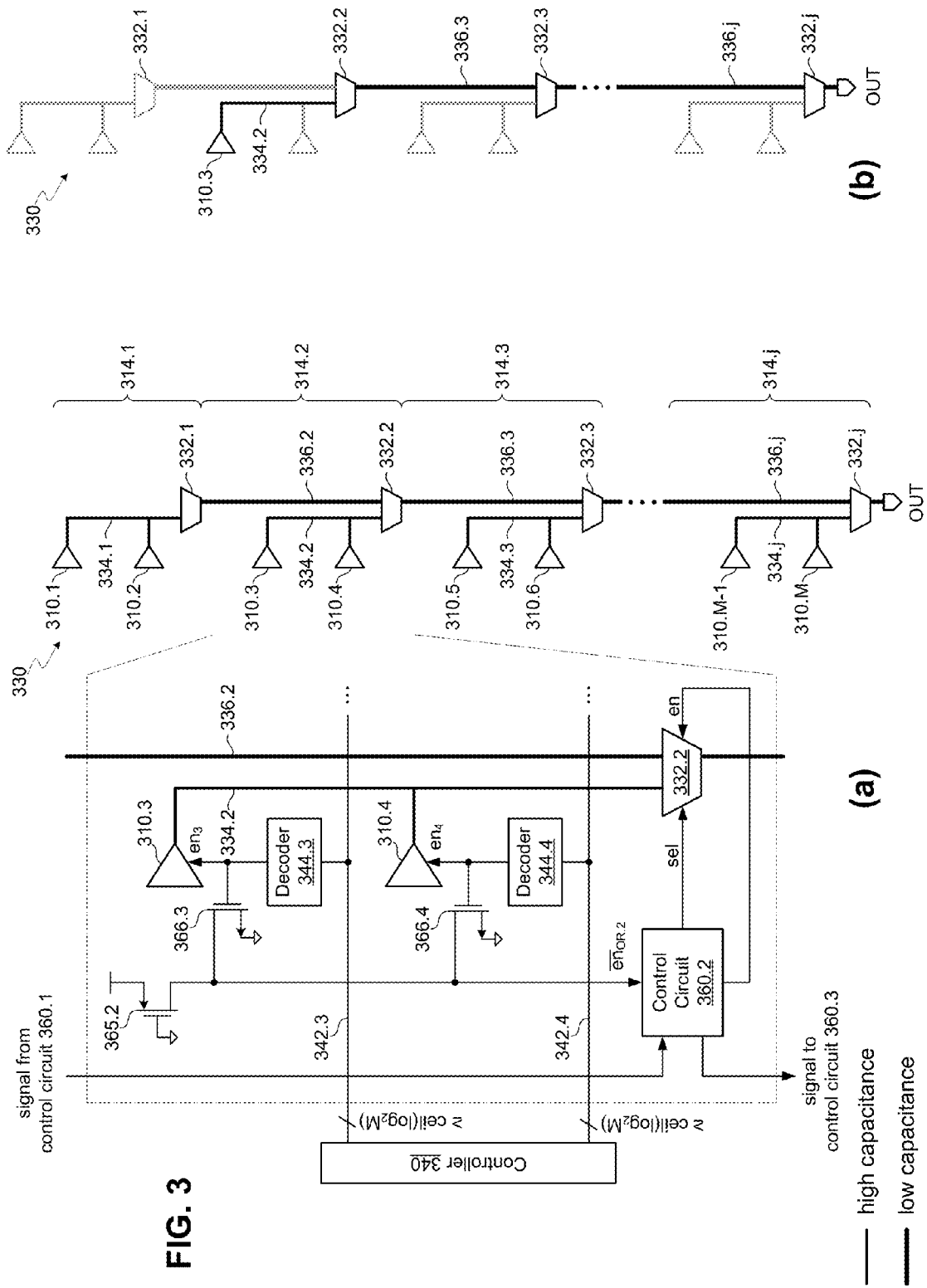
FIG. 3 illustrates an output pathway according to an embodiment of the present disclosure.

FIG. 3 illustrates an output pathway 330 according to an embodiment of the present disclosure. The output pathway 330 may correspond to one of the output pathways 130.1-130.N of FIG. 1. As shown in FIG. 3(a), the output pathway 330 may include a plurality of point cells 310.1-310.M arranged into a plurality of groups 314.1-314.j and a plurality of multiplexers 332.1-332.j, one for each group 314.1, . . . , 314.j. Within each group 314.1, . . . , 314.j, the corresponding demultiplexer 332.1, . . . , 332.j may receive a signal from either one of the point cells within the group or an adjacent upstream multiplexer.

The output pathway 330 may be segmented into a plurality of groups 314.1-314.j by a plurality of multiplexers 332.1-332.j. The number of groups and the number of point cells per group may be tailored to suit individual application needs. Within each group (say, group 314.2), the output pathway 330 may include an output main path 334.2 and an output bypass path 336.2. The output main path 334.2 may be a transmission line that carries an output signal from one of the point cells 310.3, 310.4. The output bypass path 336.2 may be a transmission line that carries a signal from a multiplexer 332.1 from a preceding group 314.1 (if any) to its multiplexer 332.2. Of course, an output bypass path is not required in a first group 314.1 of the output pathway 330, preceding the first multiplexer 332.1. The final multiplexer 332.j may have an output OUT that outputs an output signal from the output pathway 330; typically the output signal may be provided to an output channel buffer (not shown) or other control apparatus.

Each multiplexer (say, multiplexer 332.2) may be enabled by a control circuit 360.2 to select between an output main path 334.2 and an output bypass path 336.2. The control circuit 360.2 may enable the multiplexer 332.2 to select the output main path 334.2 based on when a signal $\overline{en}_{OR.2}$ is low, which is indicative of when one of its associated point cells 310.3, 310.4 is enabled. The point cells 310.1-310.M may be enabled in a similar fashion as point cells 210.1-210.N using a controller 340, multibit (ceil($\log_2$ M)) address lines 342.1-342.M, and decoders 344.1-344.M, as discussed above. However, one of the point cells 310.1-310.M may be enabled at a time in the output pathway 330. For clarity, only address lines 342.3-342.4 and decoders 344.3-344.4 are shown in FIG. 3(a). The control circuit 360.2 may enable the multiplexer 332.2 to select the output bypass path 336.2 when it receives a signal from an upstream control circuit 360.1 indicating that one of the point cells in the upstream groups (i.e., group 360.1 here) is activated. Similarly, the control circuit 360.2 may provide a signal to an adjacent downstream control circuit 360.3 to indicate that one of the point cells in either its group or one of the upstream groups is activated.

Each group (say group 314.2) may include a p-type transistor 365.2 having its drain coupled to the control circuit 360.2 and drains of a plurality of n-type transistors 366.3, 366.4. The control circuit 360 is shown with two n-type transistors 366.3, 366.4, but may be tailored to have as many transistors as the number of point cells in a group of an output path (e.g., group 314.1, . . . , 314.j). The transistor 365.2 may have its source pulled up to a high voltage supply and its gate grounded. The transistors 366.3, 366.4 may have their sources grounded or pulled down to a low voltage supply, and may receive enable signals $en_3$, $en_4$ respectively at their gates. When the point cells 310.3, 310.4 are inactive (e.g., the enable signals $en_3$, $en_4$ are low), the transistor 365.2 may pull the signal $\overline{en}_{OR.2}$ high. However, when one of the point cells 310.3, 310.4 get enabled (e.g., one or both of the enable signals $en_3$, $en_4$ are high), the corresponding transistors 366.3, 366.4 may pull the signal $\overline{en}_{OR.2}$ low. The control circuit 360.2 may enable the multiplexer 332.2 to select the output main path 334.2 when the signal $\overline{en}_{OR.2}$ is low, as will be described below in FIGS. 6 and 7.

A configuration of the output pathway 330 is shown in FIG. 3(b), where a point cell 310.3 may be enabled. In this scenario, a control circuit 360.2 associated with the enabled point cell 310.3 may enable the corresponding multiplexer 332.2 to select an output main path 334.2 and send a signal serially downstream to control circuits 360.3-360.j to enable their corresponding multiplexers 332.3-332.j to select output bypass paths 336.3-336.j. As such, a signal output by the point cell 310.3 may be driven through the output main path 334.2 and the output bypass paths 336.3-336.j, and outputted at the output OUT.

As can be seen from this example, a multiplexer 332.2 may select an output main path when one point cell 310.3 corresponding to the multiplexer 332.2 is enabled. If none of the point cells in a group is enabled, the corresponding multiplexer may be either enabled to select an output bypass path (e.g., the multiplexers 336.3-336.j) or completely disabled (e.g., the multiplexer 332.1).

Figure 4:
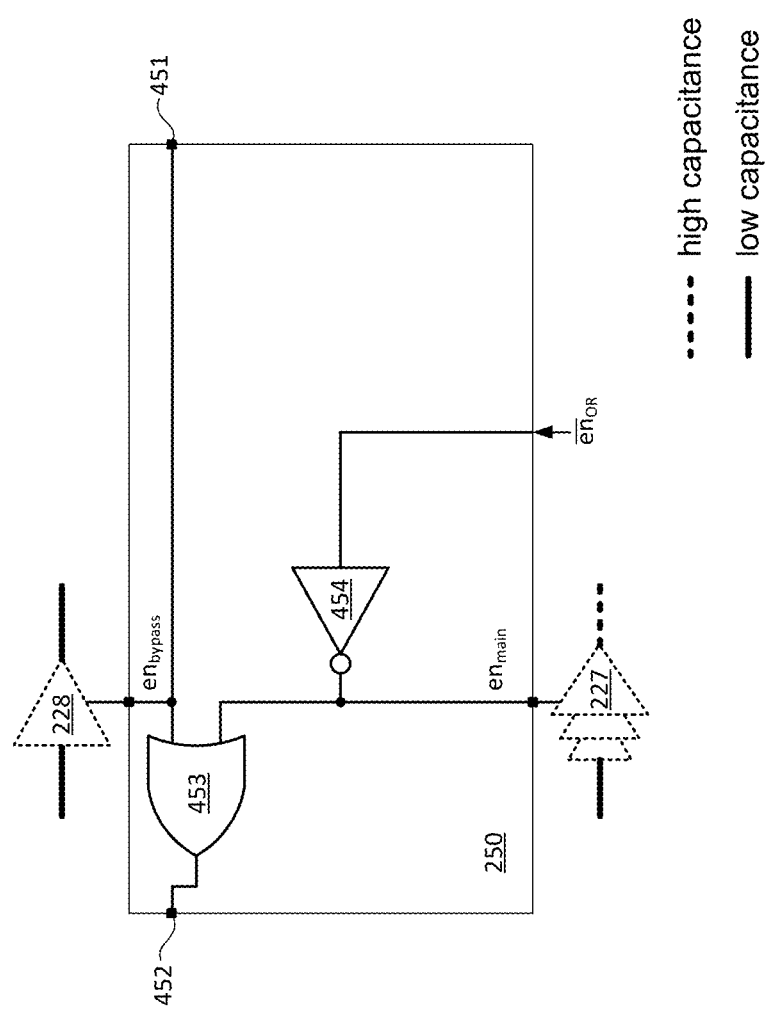
FIG. 4 illustrates a control circuit according to an embodiment of the present disclosure.

FIG. 4 illustrates a control circuit 250 according to an embodiment of the present disclosure. The control circuit 250 may be an example of the control circuit 250.1, . . . , 250.i corresponding to the group 212.1, . . . , 212.i of the input pathway 220 of FIG. 2. The control circuit 250 may include an input terminal 451, an output terminal 452, and an OR gate 453 having an output connected to the output terminal 452, a first input connected to the input terminal 451, and a second input connected to an output of a NOT gate 454. An input of the NOT gate 454 may receive a signal $\overline{en}_{OR}$, which may be indicative of one or more point cells being enabled in a group associated with the control circuit 250. The output of the OR gate 453 may be switched high when one or both of the output of the NOT gate 454 is high and the control circuit 250 receives a high signal at its input terminal 451, from another downstream control circuit, for example. As will be shown in FIG. 5, a high signal from the OR gate 453 may be transmitted via the output terminal 452 to another upstream control circuit.

FIG. 4 explicitly illustrates a main buffer 227 and a bypass buffer 228, which may correspond to a main buffer and a bypass buffer of the demultiplexers shown in FIG. 2. The main buffer 227 may be enabled when a signal $en_{main}$, corresponding to the output of the NOT gate 454, is high. The bypass buffer 228 may be enabled when the signal $en_{bypass}$, corresponding to the signal received at the input terminal 452, is high. For an input pathway with a plurality of groups of point cells, the control circuit 250 may be replicated for each group and connected in cascade. For example, referring to the input pathway 220 of FIG. 2, the control circuit 250 may be replicated i times, one for each of the groups 212.1-212.i.

Figure 5:
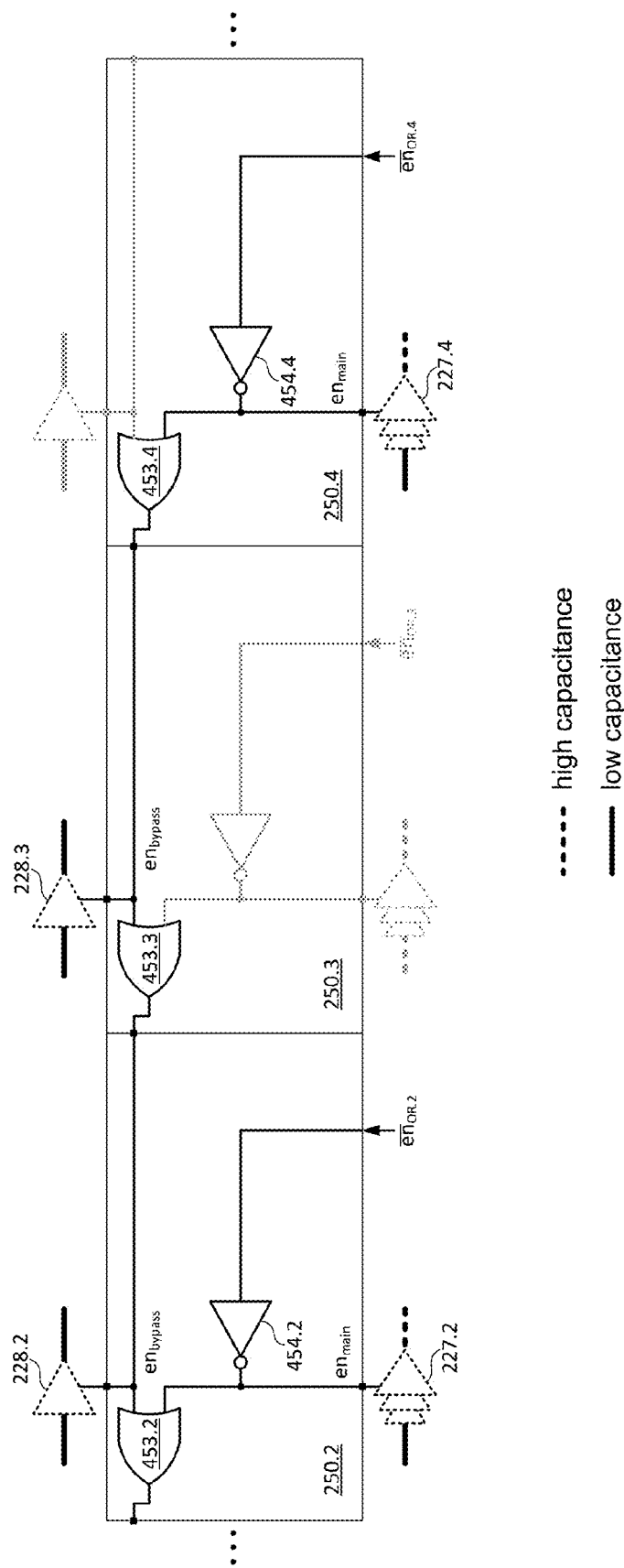
FIG. 5 illustrates control circuits of FIG. 4 replicated and connected in cascade according to an embodiment of the present disclosure.

FIG. 5 illustrates a plurality of control circuits 250 of FIG. 4 replicated and connected in cascade, according to an embodiment of the present disclosure. In particular, FIG. 5 shows a portion of a cascade connection that may be applied to the input pathway 220 shown in FIG. 2. As discussed, the input pathway 220 may include i control circuits 250.1-250.i corresponding to the groups 212.1-212.i. However, for illustration purposes, only control circuits 250.2-250.4 are shown in FIG. 5. In the configuration of FIG. 2(b), the point cells 210.3, 210.4 corresponding to control circuit 250.2 and the point cell 210.8 corresponding to control circuit 250.4 may be enabled. As such, a low signal $\overline{en}_{OR.2}$ may switch the output of a NOT gate 454.2 high, enabling the main buffer 227.2 and switching the output of an OR gate 453.2 high. The control circuit 250.2 may provide the high output of the OR gate 453.2 to the upstream control circuit 250.1 (not shown) to enable to the bypass buffer 228.1 (not shown). Similarly, a low signal $\overline{en}_{OR.4}$ may switch the output of a NOT gate 454.4 high, enabling the main buffer 227.4 and switching the output of an OR gate 453.4 high. The control circuit 250.4 may provide the high output of the OR gate 453.4 serially upstream through the control circuits 250.1-250.3, switching high outputs of OR gates 453.1-453.3 and enabling bypass buffers 228.1-228.3.

Figure 6:
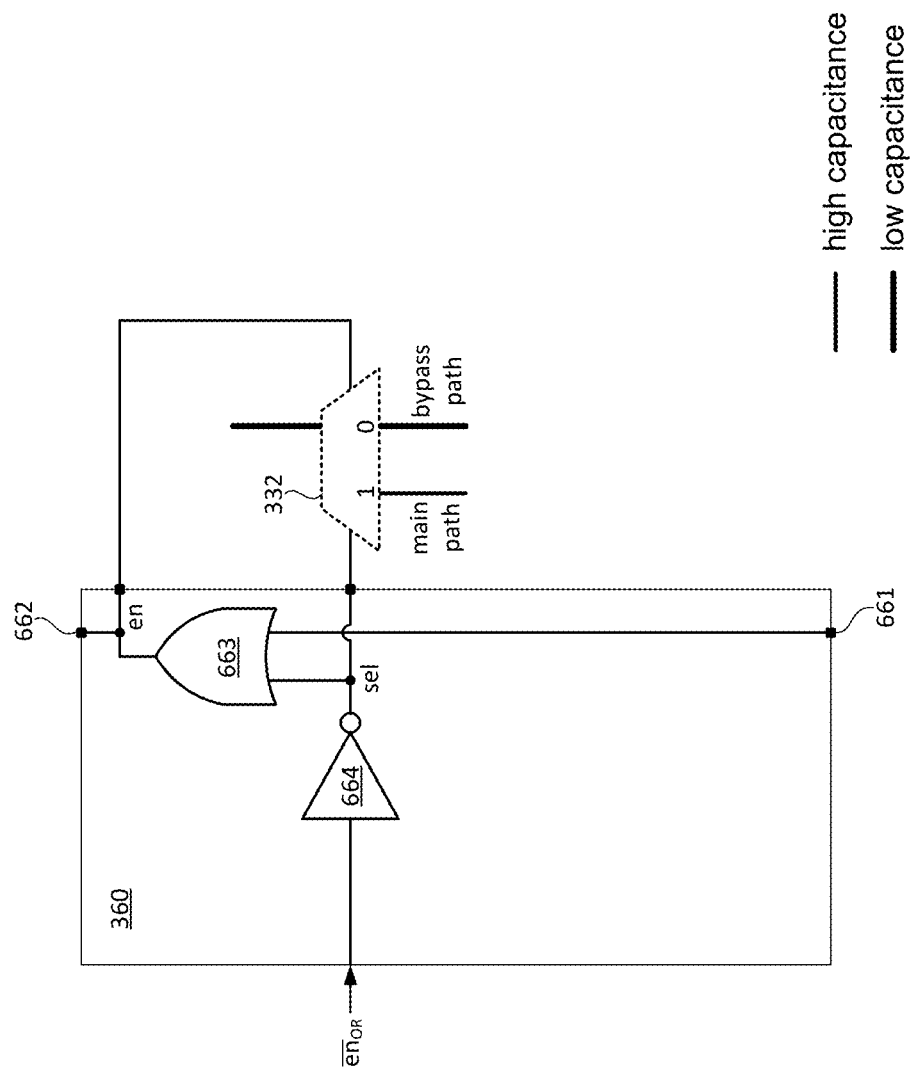
FIG. 6 illustrates a control circuit according to an embodiment of the present disclosure.

FIG. 6 illustrates a control circuit 360 according to an embodiment of the present disclosure. The control circuit 360 may be an example of the control circuit 360.1, . . . , 360.j corresponding to the group 314.1, . . . , 314.j of the output pathway 330 of FIG. 3. The control circuit 360 may include an input terminal 661, and output terminal 662, and an OR gate 663 having an output connected to the output terminal 662, a first input connected to the input terminal 661, and a second input connected to an output of a NOT gate 664. An input of the NOT gate 664 may receive a signal $\overline{en}_{OR}$ which may be indicative of one point cell being enabled in a group associated with the control circuit 360. The output of the OR gate 663 may be switched high when one or both of the output of the NOT gate 664 is high and the control circuit 360 receives a high signal at its input terminal 661, from another upstream control circuit, for example. As will be shown in FIG. 7, a high signal from the OR gate 663 may be transmitted via the output terminal 662 to another downstream control circuit 600.

FIG. 6 explicitly illustrates a multiplexer 332, which may correspond to each of the multiplexers shown in FIG. 3. The multiplexer 332 may be enabled when the output of the OR gate 663 (i.e., signal en) is high. Further, the multiplexer 332 may select between a main path and a bypass path when the output of the NOT gate 664 is high (i.e., signal sel=1) and low (i.e., signal sel=0), respectively. The multiplexer 332 thus may pass a signal from the selected path to its output. For an output pathway with a plurality of groups of point cells, the control circuit 360 may be replicated for each group and connected in cascade. For example, referring to the output pathway 330 of FIG. 3, the control circuit 360 may be replicated j times, one for each of the groups 314.1-314.j.

Figure 7:
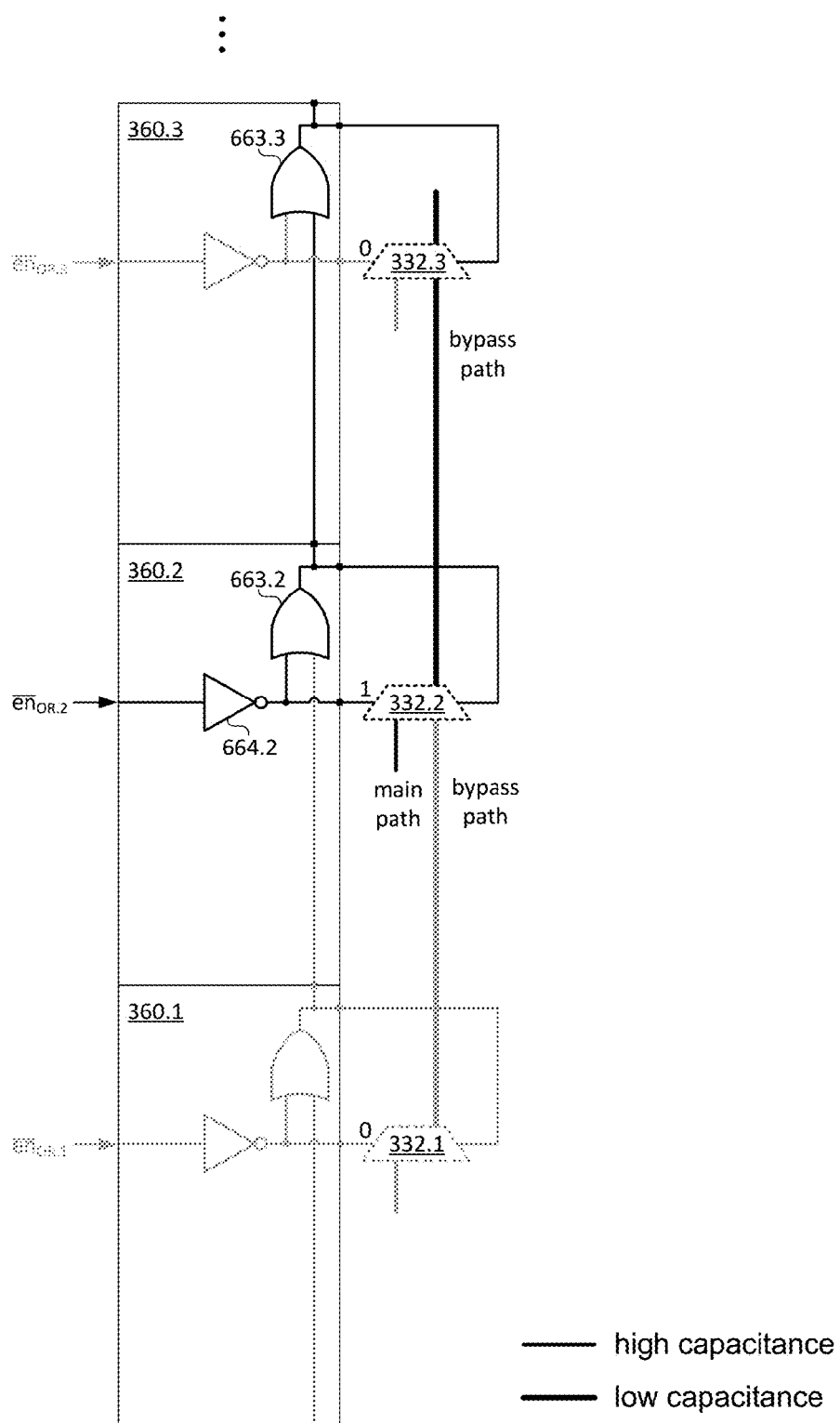
FIG. 7 illustrates control circuits of FIG. 6 replicated and connected in cascade according to an embodiment of the present disclosure.

FIG. 7 illustrates a plurality of control circuits 360 of FIG. 6 replicated and connected in cascade, according to an embodiment of the present disclosure. In particular, FIG. 7 shows a portion of a cascade connection that may be applied to the output pathway 330 shown in FIG. 3. As discussed, the output pathway 330 may include j control circuits 360.1-360.j corresponding to the groups 314.1-314.j. However, for illustration purposes, only control circuits 360.1-360.3 are shown in FIG. 7. In the configuration of FIG. 3(b), the point cell 310.3 corresponding to the control circuit 360.2 may be enabled. As such, a low signal $\overline{en}_{OR.2}$ may switch high the output of a NOT gate 664.2 and the output of an OR gate 663.2. As a result, the multiplexer 332.2 may be enabled to select its main path (which is coupled to the output of the point cell 310.3). The control circuit 360.2 may provide the high output of the OR gate 663.2 to the downstream control circuit 360.3 to enable to the multiplexer 332.3 to select the bypass path at its input. Similarly, the control circuit 360.3 may provide the high output of an OR gate 663.3 serially downstream through the control circuits 360.4-360.j (not shown) to enable corresponding multiplexers 332.4-332.j (not shown) to select the bypass paths at their respective inputs.

Figure 8:
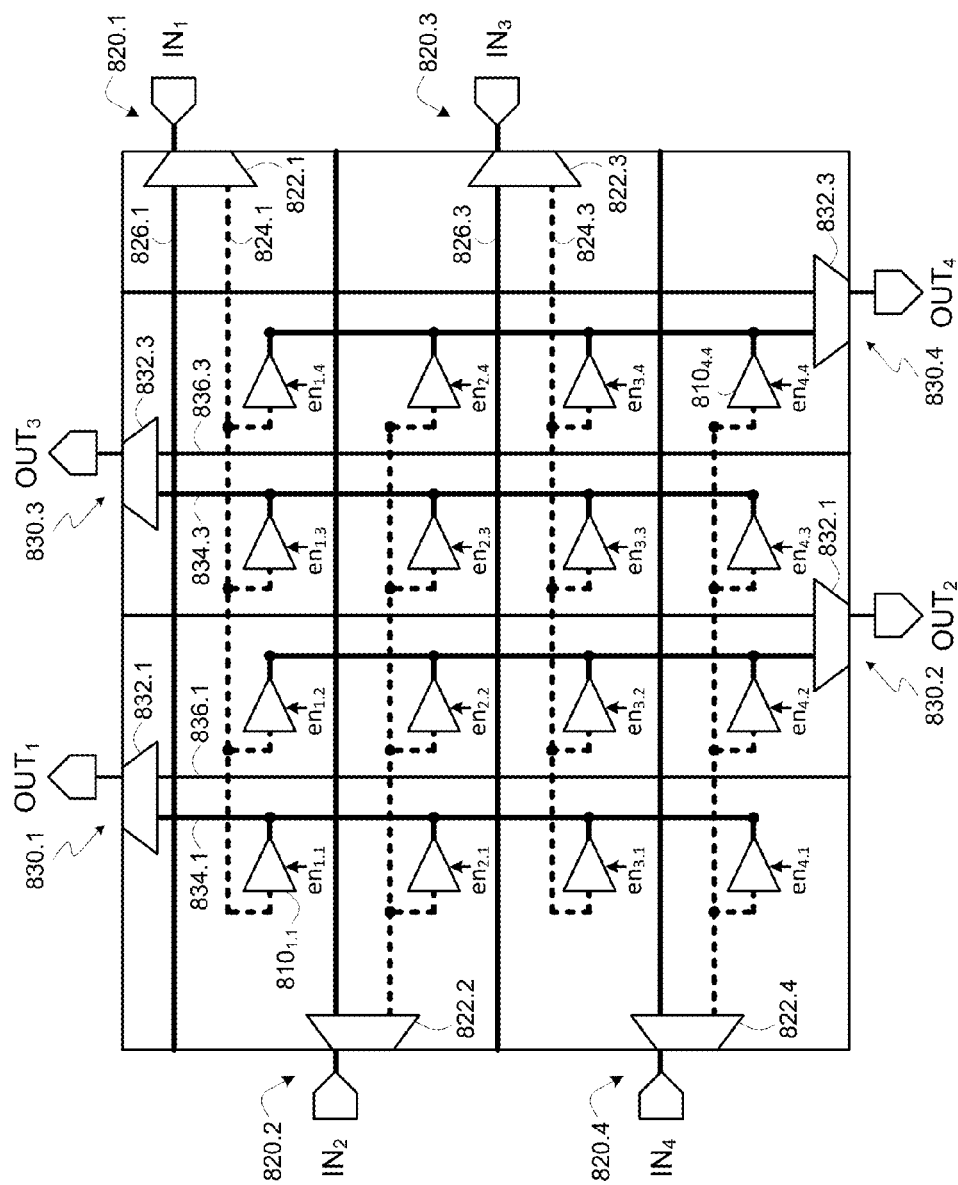
FIG. 8 illustrates a tile according to an embodiment of the present disclosure.
Figure 9:
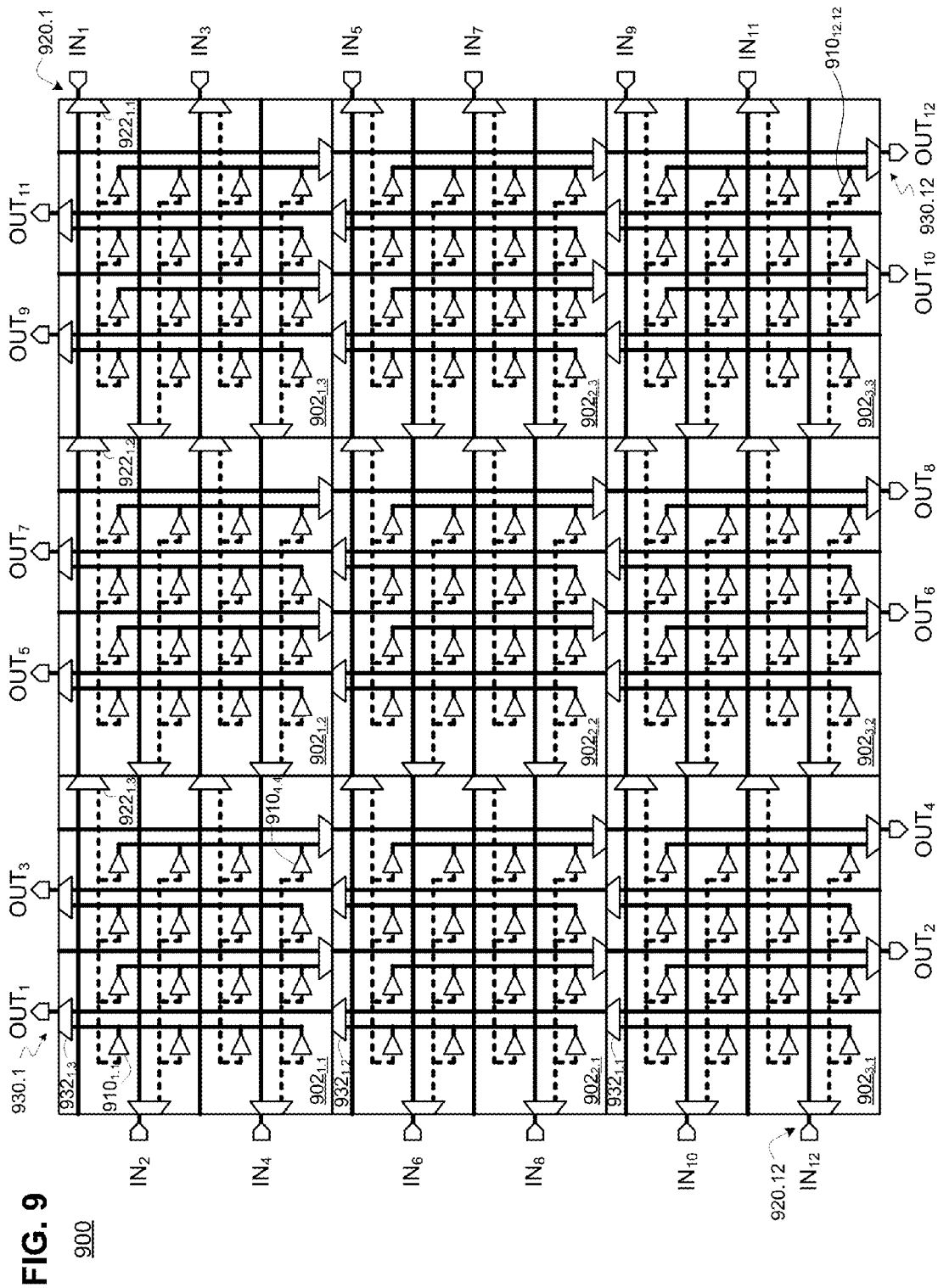
FIG. 9 illustrates a crosspoint switch according to an embodiment of the present disclosure.

The principles of the present disclosure provide a further advantage in design of crosspoint switch matrixes. By partitioning input and output signal pathways into groups, circuit designers may build modular "tiles" of input and output signal pathway segments, then build larger switch matrices therefrom by joining tiles together. A plurality of tiles may be laid out to fabricate a larger switch matrix as a single die. Alternatively, a plurality of tiles may fabricated as separate dies that may be tiled or stacked and connected by bond wires or through-silicon vias (TSVs). FIGS. 8 and 9 illustrate exemplary tiles and possible uses thereof.

FIG. 8 illustrates a tile 800 according to an embodiment of the present disclosure. The tile 800 is illustrated as a matrix of point cells $810_{1.1}$-$810_{4.4}$ arranged along a single input pathway group and a single output pathway group. In general, the tile may include a P×Q matrix of point cells where Q represents the number of point cells that are included in an input pathway group and P represents the number of point cells that are included in an output pathway group. Thus, if a tile includes Q point cells per input pathway group, there will be Q output pathways 830.1-830.Q, one per point cell in the input pathway group.

Similarly, if a tile includes P point cells per output pathway group, there will be P input pathways 820.1-820.P, one per point cell in the output pathway group. In this example, an input pathway group includes four point cells and an output pathway group also includes four point cells and, thus, FIG. 8 illustrates a 4×4 matrix of point cells $810_{1.1}$-$810_{4.4}$. But, of course, circuit designers may tailor the parameters P and Q to suit individual application needs.

The tile 800 may include a point cell $810_{1.1}$, . . . , $810_{4.4}$ at the intersection between the input pathways 820.1-820.4 and the output pathways 830.1-830.4. Each input pathway 820.1, . . . , 820.4 may include a demultiplexer 822.1, . . . , 822.4, a first transmission line that carries signals from the demultiplexer 822.1, . . . , 822.4 to associated point cells, and a second transmission line that carries signals the demultiplexer 822.1, . . . , 822.4 to other tiles in an array. Each output pathway 830.1, . . . , 830.4 may include a multiplexer 832.1, . . . , 832.4, a first transmission line that carries signals from associated point cells to the multiplexer 832.1, . . . , 832.4, and a second transmission line that carries signals from other tiles in an array to the multiplexer 832.1, . . . , 832.4. Thus, each point cell $810_{1.1}$-$810_{4.4}$ within the crosspoint matrix may receive an input signal from its associated demultiplexer on an input pathway and may output a signal to its associated multiplexer on an associated output pathway. Communication between tiles along the input and output pathways may occur via the second transmission lines.

FIG. 9 illustrates a crosspoint switch 900 according to an embodiment of the present disclosure. The switch 900 is an exemplary application of the tile 800 of FIG. 8. The switch 900 may be provisioned as a plurality of connected modular tiles $902_{1.1}$-$902_{3.3}$ to form a larger matrix of arbitrary size. Thus, working from the exemplary 4×4 tile of FIG. 8, FIG. 9 illustrates a larger 12×12 matrix that is assembled from a 3×3 array of tiles $902_{1.1}$-$902_{3.3}$. By virtue of the tile arrangement, each input pathway (say, pathway 920.1) is segmented into three groups by three demultiplexers $922_{1.1}$-$922_{1.3}$, and each output pathway (say, pathway 930.1) is segmented into three groups by three multiplexers $932_{1.1}$-$932_{1.3}$. Each demultiplexer $922_{1.1}$, . . . , $922_{1.3}$ may drive signals to its respective point cells and/or to a downstream demultiplexer from an adjacent tile (if any). Each multiplexer $932_{1.1}$-$932_{1.3}$ may receive signals from either one of its respective point cells or from an upstream multiplexer from an adjacent tile (if any). The point cells $910_{1.1}$-$910_{12.12}$ may be enabled by a controller (not shown; e.g., controller 204). The demultiplexers may be controlled by control circuits similar to the ones in FIGS. 4 and 5, described above. The multiplexers may be controlled by control circuits similar to the ones in FIGS. 6 and 7, described above.

In FIG. 9, the crosspoint switch 900 is shown as a 3×3 array of tiles $902_{1.1}$-$902_{3.3}$. Each tile $902_{1.1}$-$902_{3.3}$ having four inputs and four outputs results in a 12-by-12 crosspoint switch 900 (i.e., twelve inputs and twelve outputs). However, as discussed, each tile 902 may generally have P inputs and Q outputs. Moreover, such a P-by-Q tile may be arrayed in any U-by-V configuration to create a (P×U)-by-(Q×V) crosspoint switch. As noted above, P and Q may not necessarily be equal. Similarly, U and V may not necessarily be equal. Therefore, square or rectangular crosspoint switches may be fabricated in arbitrary sizes. The inventor contemplates building large scale crosspoint matrices according to these principles, for example, 160×160 matrices.

Figure 10:
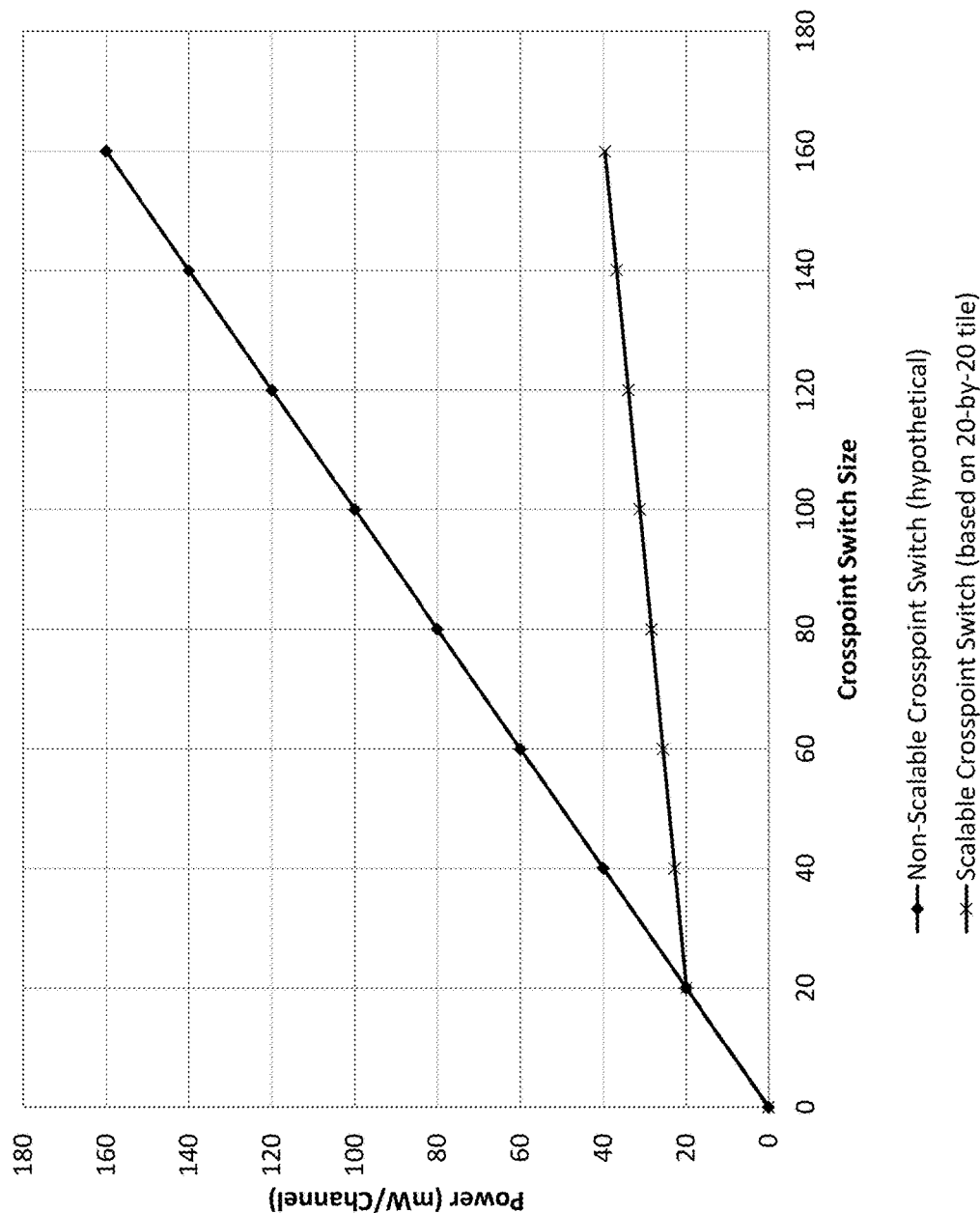
FIG. 10 is a plot illustrating power consumption according to an embodiment of the present disclosure.

FIG. 10 is a plot illustrating power consumption versus crosspoint switch size according to an embodiment of the present disclosure. In particular, the plot illustrates theoretical power consumption of scalable crosspoint switches such as the one in FIG. 9, compared to a hypothetical power consumption of non-scalable crosspoint switches. In this example, the scalable crosspoint switches are based on a 20-by-20 tile (i.e., 20 inputs and 20 outputs). However, similar observations may be made for tiles of different sizes. As can be seen in FIG. 10, for a crosspoint switch size of 20 (i.e., 20-by-20), both the scalable and non-scalable crosspoint switches consume the same amount of power. This is because, with a 20-by-20 tile, the scalable crosspoint switch includes a single tile and may not provide any advantage over the non-scalable crosspoint switch. However, as the crosspoint switch increases (in increments dictated by the size of one tile), the scalable crosspoint switches shows reduction in power consumption when compared to the non-scalable crosspoint switches. While the power consumption of the non-scalable crosspoint switches may increase linearly with size, there may be a smaller increase in power consumption for the scalable crosspoint switches. As the switch size increases, the difference in power consumption may become more considerable, as illustrated by the diverging lines in FIG. 10.

Figure 11:
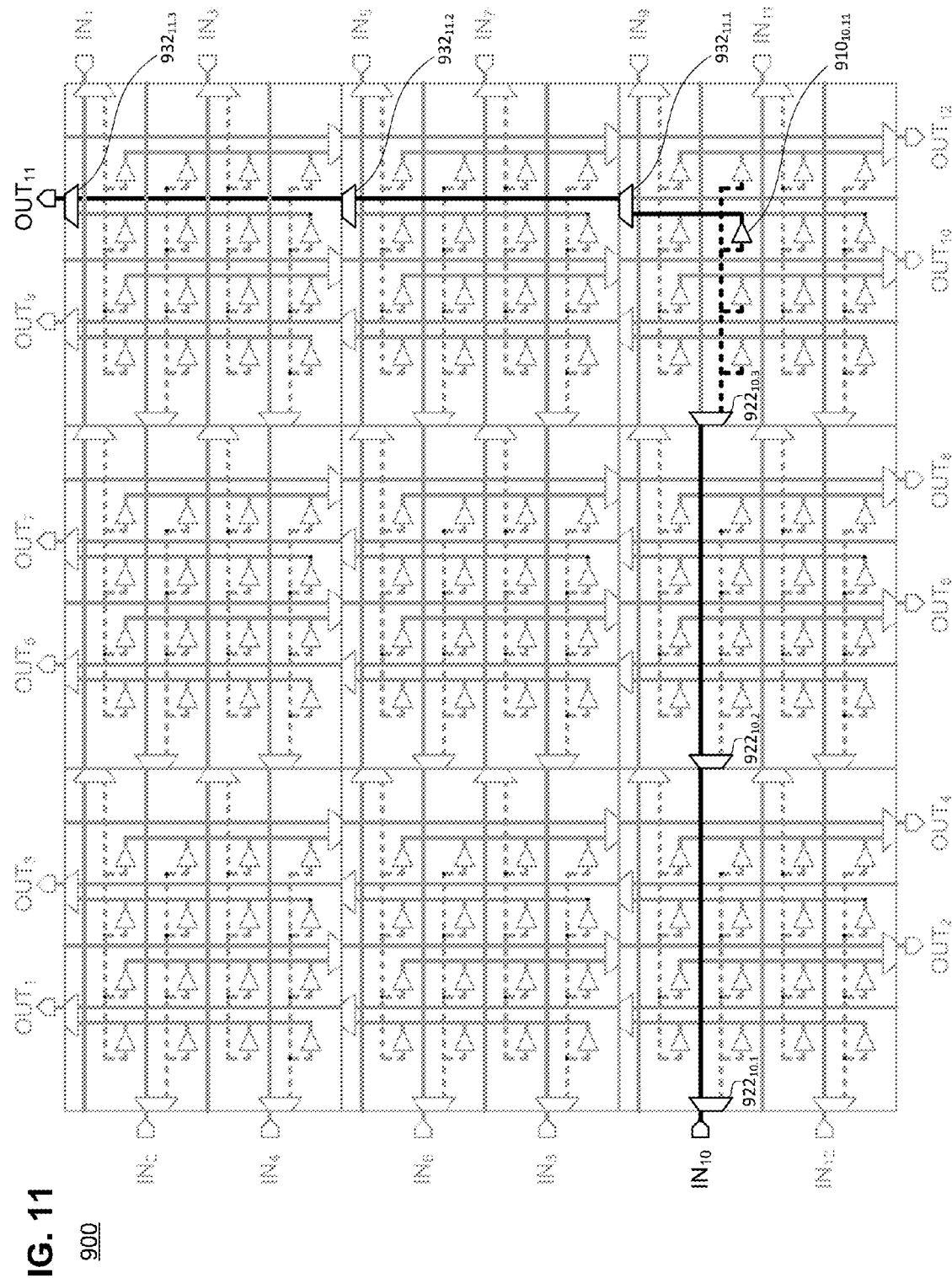
FIG. 11 illustrates an exemplary usage of the crosspoint switch of FIG. 9 according to an embodiment of the present disclosure.

FIG. 11 illustrates an exemplary usage of the crosspoint switch 900 according to an embodiment of the present disclosure. FIG. 11 illustrates the crosspoint switch 900 in a unicast transmission mode. During a unicast, one of a plurality of point cells $910_{1.1}$-$910_{12.12}$ may be enabled such that the crosspoint switch 900 may transmit a signal from one of a plurality of inputs $IN_1$-$IN_{12}$ to one of a plurality of outputs $OUT_1$-$OUT_{12}$. In the example of FIG. 11, a point cell $910_{10.11}$ associated with the input $IN_{10}$ and the output $OUT_{11}$ may be enabled (e.g., by an enable signal $en_{10,11}$ from a controller). Enabling the point cell $910_{10,11}$ enables a main buffer of a demultiplexer $922_{10.3}$ and bypass buffers of upstream demultiplexers $922_{10.1}$, $922_{10.2}$ such that an input signal may be driven from the input $IN_{10}$ to the point cell $910_{10, 11}$. Enabling the point cell $910_{10,11}$ also enables a multiplexer $932_{11.1}$ to select its main path, and downstream multiplexers $932_{11.2}$, $932_{11.3}$ to select their bypass paths such that the signal received by the point cell $910_{10,11}$ may be driven to the output $OUT_{11}$. Thus, the crosspoint switch 900 may transmit a signal from input $IN_{10}$ to the output $OUT_{11}$.

Figure 12:
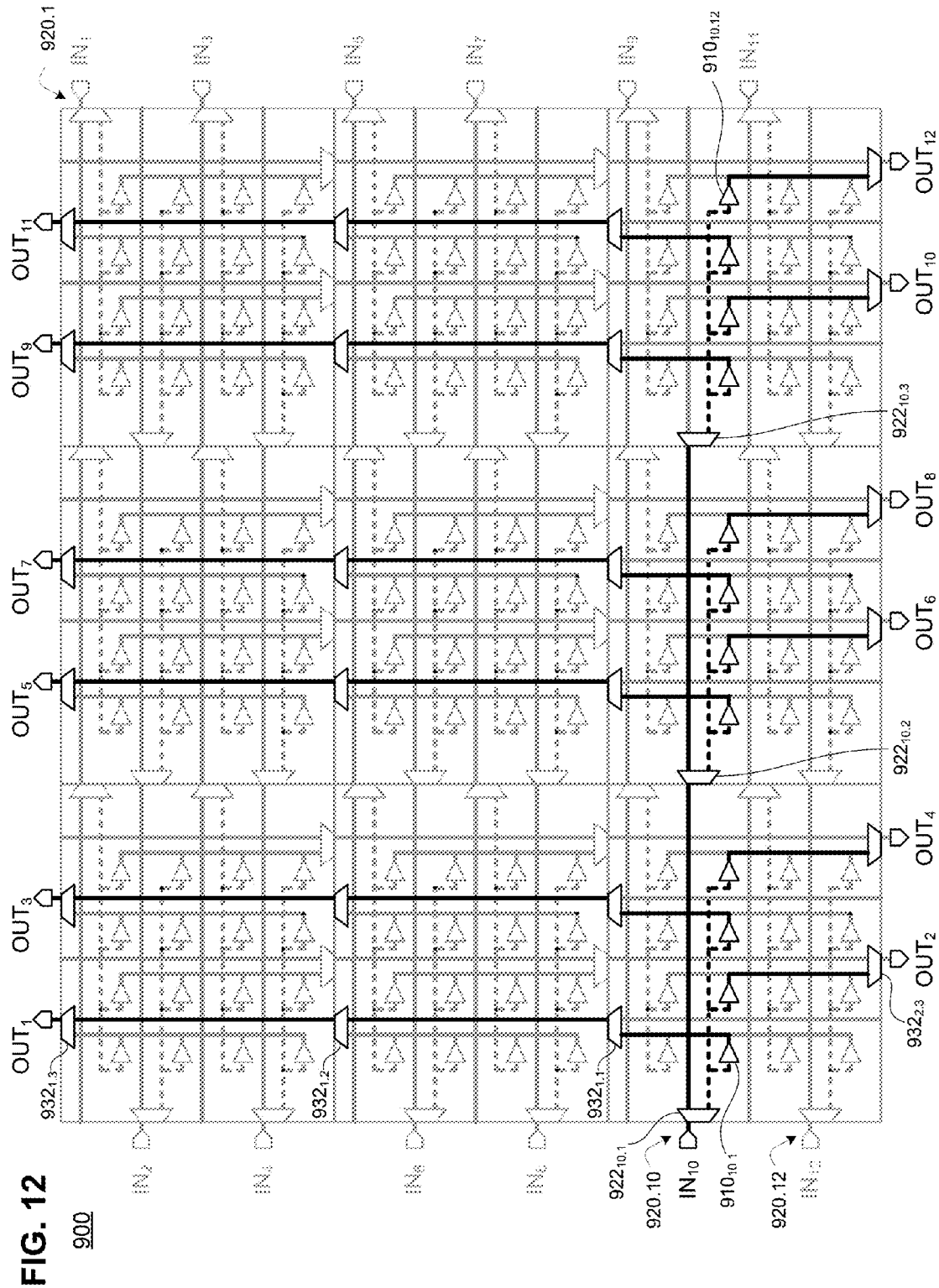
FIG. 12 illustrates an exemplary usage of the crosspoint switch of FIG. 9 according to an embodiment of the present disclosure.

FIG. 12 illustrates an exemplary usage of the crosspoint switch 900 according to an embodiment of the present disclosure. FIG. 12 illustrates the crosspoint switch 900 in a broadcast transmission mode. During a broadcast, each point cell in one of a plurality of input pathways 920.1-920.12 may be enabled such that the crosspoint switch 900 may transmit a signal from one of a plurality input $IN_1$-$IN_{12}$ to each of a plurality of outputs $OUT_1$-$OUT_{12}$. In the example of FIG. 12, point cells $910_{10.1}$-$910_{10.12}$ associated to the input path 920.10 may be enabled, consequently enabling main buffers of their associated demultiplexers $922_{10.1}$-$922_{10.3}$ to drive a signal from the input $IN_{10}$ and bypass buffers of upstream demultiplexers $922_{10.2}$-$922_{10.3}$ to bypass the signal. Enabling the point cells $910_{10.1}$-$910_{10.12}$ also enables their associated multiplexers to select their corresponding main paths and any downstream multiplexers to select their bypass paths. For example, enabling the point cell $910_{10.1}$ enables multiplexer $932_{1.1}$ to select its main path and downstream multiplexers $932_{1.2}$, $932_{1.3}$ to select their main paths such that the signal may be driven to the output $OUT_1$. On the other hand, enabling the point cell $910_{10.2}$ enables the multiplexer $932_{2.3}$ to select its main path such that the signal may be driven to the output $OUT_2$. The crosspoint switch 900 thus may transmit a signal from the input $IN_{10}$ to outputs $OUT_1$-$OUT_{12}$.

Figure 13:
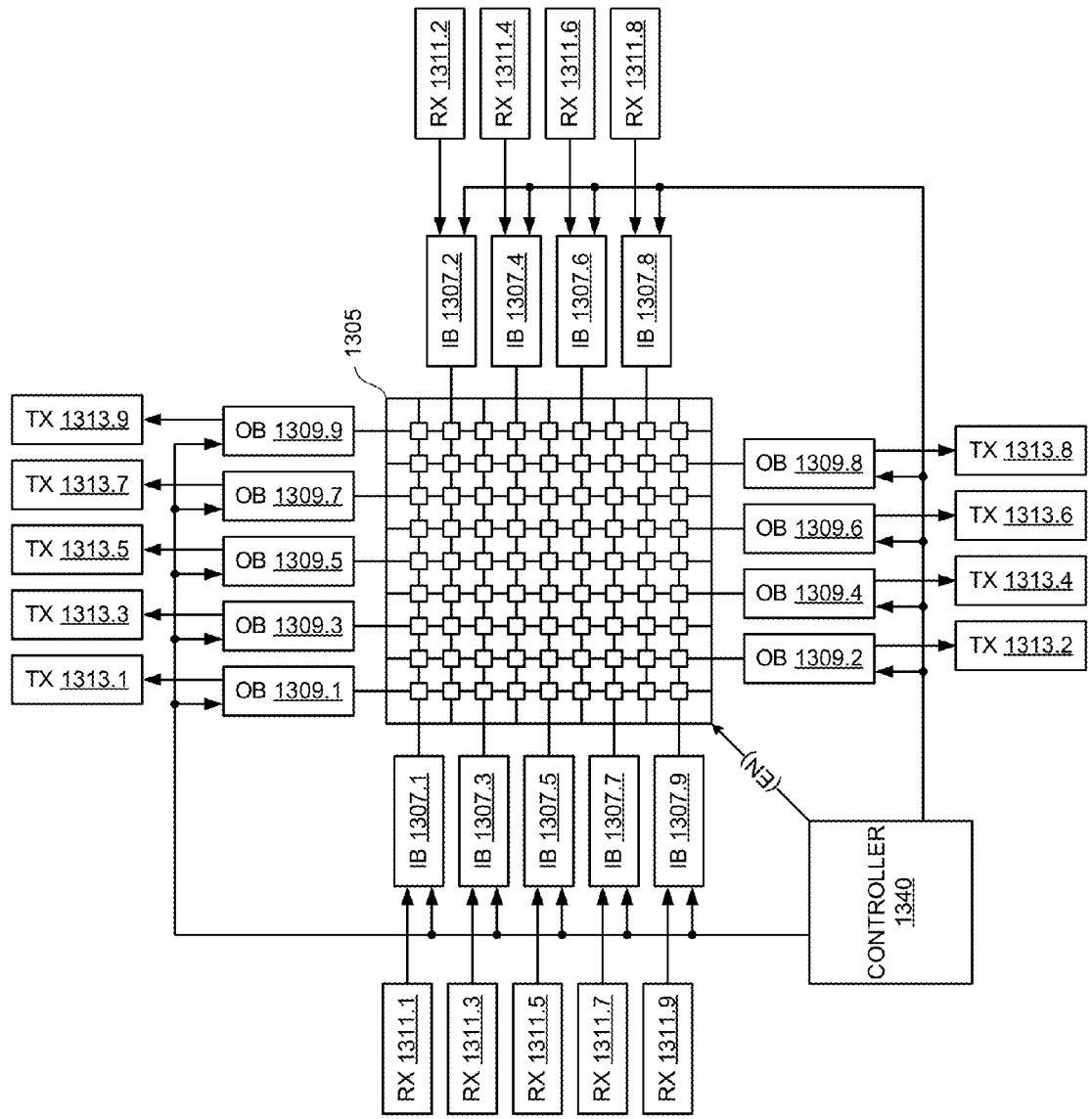
FIG. 13 illustrates a crosspoint switch system according to an embodiment of the present disclosure.

FIG. 13 illustrates a crosspoint switch system 1300 according to an embodiment of the present disclosure. The system 1300 may include a switch matrix 1305, a plurality of input buffers 1307.1-1307.9, a plurality of output buffers 1309.1-1309.9, a plurality of data sources 1311.1-1311.9, and a plurality of data sinks 1313.1-1313.9. The switch matrix 1305 may include input pathways and/or output pathways that are segmented into groups according to one of the foregoing embodiments. The system 1300 may also include a controller 1340 to control the flow of data to, through, and from the switch 1305.

The input buffers 1307.1-1307.9 may receive input data from the data sources 1311.1-1311.9 and may store the input data until it can be scheduled for transmission through the switch 1305. The input buffers 1307.1-1307.9 and/or the data sources 1311.1-1311.9 may provide signal conditioning functions (e.g., equalization, etc.) to condition the input data before transmitting the input data to the switch 1305. The output buffers 1307.1-1307.9 may store output data that is routed to them by the switch matrix 1305 until it can be transmitted to the data sinks 1313.1-1313.9. The output buffers 1307.1-1307.9 and/or the data sinks 1313.1-1313.9 may provide signal conditioning functions (e.g., voltage level restoration, offset correction, etc.) to condition the output data before outputting the output data from the crosspoint switch system 1300. The controller 1340 may be provided in communication with the input buffers and output buffers and related equipment (e.g., transceivers (not shown)) to decode input data, determine transmission modes that are required for the input data (e.g., unicast, broadcast or some hybrid thereof), schedule the input data for transmission, and enable point cells (as discussed) of the switch 1305 accordingly.

Several embodiments of the disclosure are specifically illustrated and/or described herein. However, it will be appreciated that modifications and variations of the disclosure are covered by the above teachings and within the purview of the appended claims without departing from the spirit and intended scope of the disclosure. Further variations are permissible that are consistent with the principles described above.

What is claimed is:

1. A switch matrix, comprising:
a plurality of point cells provided respectively at intersections between a plurality of input pathways and a plurality of output pathways,
wherein at least one pathway of the input pathways and the output pathways are partitioned into a plurality of groups, wherein said partitioning includes at least one pathway being split into a common communication path coupled to all point cells in a group for each of the plurality of groups, and a bypass path connecting different groups of the plurality of groups.

2. The switch matrix of claim 1, wherein the common communication path of each group has a higher capacitance than a capacitance of the bypass path of each group.

3. The switch matrix of claim 1, wherein the input pathways are partitioned into groups by respective demultiplexers, each of said demultiplexers having a first output coupled to the bypass path and a second output coupled to inputs of the point cells of the respective groups.

4. The switch matrix of claim 3, further comprising a plurality of control circuits, one for each group and comprising a bypass path sub-controller and a main path sub-controller, wherein bypass path sub-controllers of intermediate groups have a first input coupled to a main path sub-controller of its associated group and a second input coupled to an output of an bypass path sub-controller of a downstream group.

5. The switch matrix of claim 1, wherein the output pathways are partitioned into groups by respective multiplexers, each of said multiplexers having a first input coupled to the bypass path and a second input coupled to outputs of the point cells of the respective groups.

6. The switch matrix of claim 5, further comprising a plurality of control circuits, one for each group and comprising a select sub-controller and an enable sub-controller, wherein an output of the select sub-controller of a group is coupled to the multiplexer of its associated group and the enable sub-controllers of intermediate groups have a first input coupled to a select sub-controller of its associated group and a second input coupled to an output of an enable sub-controller of an upstream group.

7. The switch matrix of claim 1, wherein each demultiplexer comprises a main buffer and a bypass buffer.

8. The switch matrix of claim 1, wherein
the input pathways and output pathways each are partitioned into a plurality of groups, and
the matrix includes a plurality of modular tiles of point cells, each tile provisioned according to a number of point cells per input pathway group and a number of point cells per output pathway group.

9. The switch matrix of claim 1, further comprising:
a plurality of input buffers to receive and store input data;
a plurality of output buffers to store output data; and
a controller to enable the point cells based on a transmission mode and to schedule the transmission of the input data from one or more of the input buffers to one or more of the output buffers.

10. A switch matrix, comprising:
a plurality of input pathways and a plurality of output pathways, each input pathway partitioned into the groups by respective demultiplexers, wherein:
first outputs of the demultiplexers define a bypass path connecting the groups together, and
second outputs of the demultiplexers are coupled to point cells of the respective groups; and
the switch matrix further comprising a control circuit to enable one or more of the demultiplexers, wherein each of the enabled demultiplexers is configured to drive one or both of a main path to the point cells and a bypass path to another demultiplexer.

11. The switch matrix of claim 10, wherein the matrix includes a plurality of modular tiles of point cells, each tile provisioned according to a number of point cells per input pathway group.

12. A switch matrix, comprising:
a plurality of input pathways and a plurality of output pathways, each output pathway partitioned into the groups by respective multiplexers, wherein:
first inputs of the multiplexers define a bypass path connecting the groups together, and
second inputs of the multiplexers are coupled to the point cells of the respective groups; and
the switch matrix further comprising a control circuit to enable one or more of the multiplexers, wherein each of the enabled multiplexers is configured to select one of a main path to the point cells and a bypass path to another multiplexer.

13. The switch matrix of claim 12, wherein the matrix includes a plurality of modular tiles of point cells, each tile provisioned according to a number of point cells per output pathway group.

14. A method, comprising:
responsive to a control signal that enables a point cell in a crosspoint switch:
controlling circuitry within a segmented input pathway associated with the enabled point cell to:
carry an input signal along an input bypass path between the input pathway's origin and an input group to which the enabled point cell belongs, and, within the point cell's group,
drive the input signal to the point cell's input, and
controlling circuitry within a segmented output pathway associated with the enabled point cell to:
carry an output signal from the enabled point cell to a terminus of the point cell's output group, and
carry the output signal from the group terminus to an output pathway terminus along another output bypass path,
wherein the input bypass path and the output bypass path bypass point cells of other groups.

15. The method of claim 14, wherein the controlling circuitry within a segmented input pathway comprises:
enabling bypass buffers of demultiplexers associated with input groups upstream of the enabled point cell's input group; and
enabling a main buffer of a demultiplexer associated with the enabled point cell's input group.

16. The method of claim 14, wherein the controlling circuitry within a segmented output pathway comprises:
enabling a multiplexer associated with the enabled point cell's output group to select a path coupled to the enabled point cell; and
enabling multiplexers associated with output groups downstream of the enabled point cell's output group to select the output bypass path.

* * * * *